US007433431B2

(12) United States Patent
Birkett

(10) Patent No.: US 7,433,431 B2
(45) Date of Patent: Oct. 7, 2008

(54) STAGGERED AGC WITH DIGITALLY CONTROLLED VGA

(75) Inventor: Neil Birkett, Richmond (CA)

(73) Assignee: Zarbana Digital Fund, LLC, Wilmington, DE (US)

( * ) Notice: Subject to any disclaimer, the term of this patent is extended or adjusted under 35 U.S.C. 154(b) by 687 days.

(21) Appl. No.: 10/661,945

(22) Filed: Sep. 12, 2003

(65) Prior Publication Data

US 2005/0058228 A1 Mar. 17, 2005

(51) Int. Cl.
- H04L 27/08 (2006.01)
- H04B 1/06 (2006.01)
- H04B 7/00 (2006.01)

(52) U.S. Cl. .................. 375/345; 375/316; 375/317; 455/232.1; 455/234.1; 455/234.2; 455/235.1; 455/245.2

(58) Field of Classification Search ......... 375/344–346, 375/349–350, 285, 316–317; 455/324, 226.1, 455/226.2, 63.1, 67.11, 232.1, 234.1, 234.2, 455/236.1, 245.1, 245.2, 283, 286, 250.1, 455/67.13

See application file for complete search history.

(56) References Cited

U.S. PATENT DOCUMENTS

| 4,531,089 | A | * | 7/1985 | Ishizuka et al. ........... 324/99 D |
| 5,014,056 | A | * | 5/1991 | Moriwaki .................... 341/161 |
| 5,043,999 | A | * | 8/1991 | Aimer et al. ................. 375/345 |
| 5,680,075 | A | * | 10/1997 | Sacca ........................ 330/279 |
| 5,828,955 | A | | 10/1998 | Lipowski et al. ............. 455/324 |
| 6,163,685 | A | * | 12/2000 | Dilling et al. ............... 455/247.1 |
| 6,308,155 | B1 | * | 10/2001 | Kingsbury et al. ........ 704/256.1 |
| 6,590,528 | B1 | * | 7/2003 | DeWulf ................... 342/357.12 |
| 6,792,254 | B1 | * | 9/2004 | Constantinidis et al. .. 455/232.1 |
| 6,892,060 | B2 | * | 5/2005 | Zheng ........................ 455/302 |
| 6,977,976 | B1 | * | 12/2005 | Birkett et al. ............... 375/345 |
| 7,110,734 | B2 | * | 9/2006 | Mohindra ................ 455/234.1 |
| 7,145,934 | B2 | * | 12/2006 | Liang ........................ 375/133 |

(Continued)

FOREIGN PATENT DOCUMENTS

EP 0 413 311 A1 2/1991

(Continued)

OTHER PUBLICATIONS

International Search Report for PCT/CA2004/001566 dated Dec. 24, 2004.

*Primary Examiner*—Mohammad Ghayour
*Assistant Examiner*—Sophia Vlahos
(74) *Attorney, Agent, or Firm*—Stolowitz Ford Cowger LLP

(57) ABSTRACT

A method of and device for automatic gain control (AGC) incorporates digitally controlled variable gain amplifiers (VGAs). An AGC circuit comprises multiple AGC stages, where each of the stages comprises: respective I and Q VGAs; a detector for detecting respective I and Q output signals received from the respective I and Q VGAs; an analogue to digital converter for converting the detected I and Q output signals; and a digital engine for adjusting the respective I and Q VGAs for differences between the detected I and Q output signals and a reference signal. Using staggered AGCs incorporating respective I and Q VGAs splits the total dynamic range between n stages, allowing for reduced gain requirements in the VGAs. Using digital control for setting the VGA gains reduces analogue variations and I/Q gain imbalances. Using multiple update rates or magnitudes in the VGA control improves dynamic settling time.

14 Claims, 10 Drawing Sheets

U.S. PATENT DOCUMENTS

| | | | |
|---|---|---|---|
| 2003/0156668 A1* | 8/2003 | Atkinson et al. | 375/345 |
| 2004/0002323 A1* | 1/2004 | Zheng | 455/324 |
| 2004/0203472 A1* | 10/2004 | Chien | 455/68 |

FOREIGN PATENT DOCUMENTS

| | | |
|---|---|---|
| EP | 1 191 686 A1 | 3/2002 |
| WO | WO 00/31867 | 6/2000 |
| WO | WO 01/15317 | 3/2001 |

* cited by examiner

STAGGERED AGC WITH DIGITALLY CONTROLLED VGA

CROSS-REFERENCE TO RELATED APPLICATIONS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever

BACKGROUND OF THE INVENTION

1. Field of Invention

The invention relates to the field of wireless communications, more particularly to a method of and device for digitally controlled variable gain amplification.

2. Description of the Related Prior Art

Rapid growth in the portable communications market has pushed designers to seek low-cost, low-power, highly integrated solutions for the RF transceiver in accordance with the IEEE 802.11a-1999 Part 11: "Wireless LAN Medium Access Control (MAC) and Physical Layer (PHY) Specifications—High Speed Physical Layer in the 5 GHz Band which is incorporated herein by reference. As those skilled in the art will appreciate, an automatic gain control (AGC) circuit is a circuit by which gain is automatically adjusted in a specific manner as a function of a specified parameter, such as received signal strength. Gain is the ratio of output current, voltage or power to input voltage or power respectively and is usually expressed in decibels (dB). If the value is less than unity, the dB gain is negative indicating a loss between input and output.

Radio receivers typically have an AGC algorithm connected to some sort of Variable Gain Amplifier (VGA) which adjusts the gain to compensate for the wide dynamic range of the input signal level. In integrated radio circuits, the use of baseband VGA's is becoming popular, however, for complex modulation schemes separate in-phase (I) and quadrature (Q) output paths are necessary. As will be appreciated by those in the art, certain radio frequency (RF) applications perform signal processing operations by separating radio frequency signals into signal components representing in-phase and quadrature channels (I and Q channels). For example, in direct conversion receivers, in-phase and quadrature phase signals are utilized to help in demodulating received signals. Generally, signals on the I and Q channel have equal amplitudes and a ninety degree phase difference, and these signals are separately processed by similar circuitry that maintain the amplitude and phase relationships. However, imperfections and mismatches in implementing circuitry may lead to an amplitude or phase imbalance, i.e., a deviation from the ideal amplitude and phase relationships.

When phase or gain imbalance distorts the received signal, subsequent signal processing is impacted. It is necessary to match the gain and phase of the VGA's used in the baseband AGC. Past solutions have used staggered AGCs with one single analogue control signal for adjusting the gain in an analogue fashion. Alternately, a single stage AGC has been used with a large dynamic range requirement. Neither of the aforementioned solutions has adequately overcome the problem highlighted above.

SUMMARY OF THE INVENTION

The present invention serves to overcome the deficiencies of the prior art by providing staggered AGCs each associated with respective I and Q digitally controlled VGAs to improve the balance between I/Q paths. Further, the control of the AGCs is done locally to the AGCs rather than globally from a DSP function in the digital portion of the receiver.

In accordance with a first aspect of the invention there is provided in a wireless receiver wherein a radio frequency signal is received, downconverted and processed into in-phase (I) and quadrature (Q) signal paths, a method of automatic gain control (AGC) comprising the steps of: (a) at a specified stage in an I/Q baseband strip containing multiple automatic gain control (AGC) stages: (i) detecting respective I and Q output signals received from respective I and Q variable gain amplifiers (VGAs) associated with the specified AGC stage; (ii) digitizing the detected I and Q signals; (iii) adjusting the respective I and Q variable gain amplifiers (VGAs) for differences between the detected I and Q output signals and a reference signal; and (b) repeating step (a) through each AGC stage.

In accordance with a second aspect of the invention there is provided in a wireless receiver wherein a radio frequency signal is received, downconverted and processed into in-phase (I) and quadrature (Q) signal paths, an automatic gain control (AGC) circuit comprising an I/Q baseband strip comprising multiple AGC stages wherein each of the AGC stages comprises: respective I and Q variable gain amplifiers (VGAs); a detector for detecting respective I and Q output signals received from the respective I and Q variable gain amplifiers (VGAs); an analogue to digital converter (ADC) for converting the detected I and Q output signals; and a digital engine for digitally adjusting the respective I and Q variable gain amplifiers (VGAs) for differences between the detected I and Q output signals and a reference signal.

The advantages of the present invention are now readily apparent. The use of staggered AGCs incorporating respective I and Q VGAs means that the total dynamic range is split between n-stages. This means that respective I and Q VGAs have reduced gain requirements and are easier to design. In addition, the use of digital control for setting the VGA gains means that analog variations are reduced and the I/Q gain imbalances can be reduced compared to using analog controlled VGA's. Finally, using locally generated feedback (as opposed to globally generated feedback) allows for the optimum arrangement for interleaved VGA's since there is typically a transport (group) delay of the signals through the interleaved blocks. By staggering the control of the VGAs in time as opposed to one single control (as in global feedback systems), improved dynamic settling can be obtained.

BRIEF DESCRIPTION OF THE DRAWINGS

A better understanding of the invention will be obtained by considering the detailed description below, with reference to the following drawings in which.

DESCRIPTION OF THE PREFERRED EMBODIMENT

Figure 1:
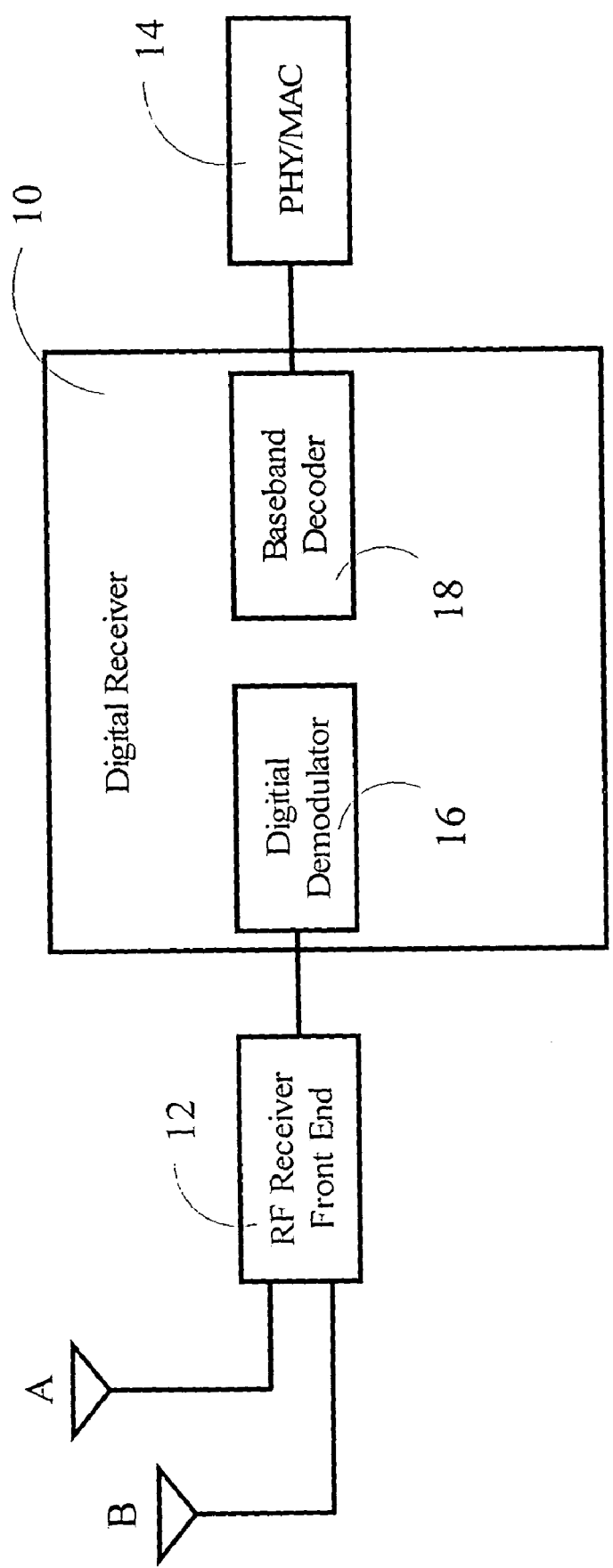
FIG. 1 depicts a block diagram of a digital receiver in accordance with the present invention.

Referring to FIG. 1, there is depicted a digital receiver 10 in which the present invention is housed. The preferred receiver may be, for example, the ICE5350 Digital Receiver offered by IceFyre Semiconductor Inc. which performs all the physical layer functions detailed in the IEEE 802.11a standard, but the invention is not meant to be limited to this receiver. The digital receiver is located between the RF Receiver Front End 12 and the Physical Medium Access Control (PHY/MAC) 14. The RF Receiver Front End connects to antennae A and B. As shown in the drawing, the two main blocks within the digital receiver 10 are the digital demodulator 16 and the baseband decoder 18. The digital demodulator 16 recovers the baseband signal by removing carrier offsets, timing offsets, compensating for the channel impairments and demapping the digitally modulated signal. This block is located between the analog-to-digital interface (not shown) and the baseband interface (not shown). The baseband decoder 18 de-interleaves the baseband signal, provides error correction through the soft-decision Viterbi algorithm and unscrambles the corrected bit stream to be passed through the PHY/MAC 14. This block is located between the baseband interface (not shown) and the PHY/MAC interface (not shown).

Figure 2:
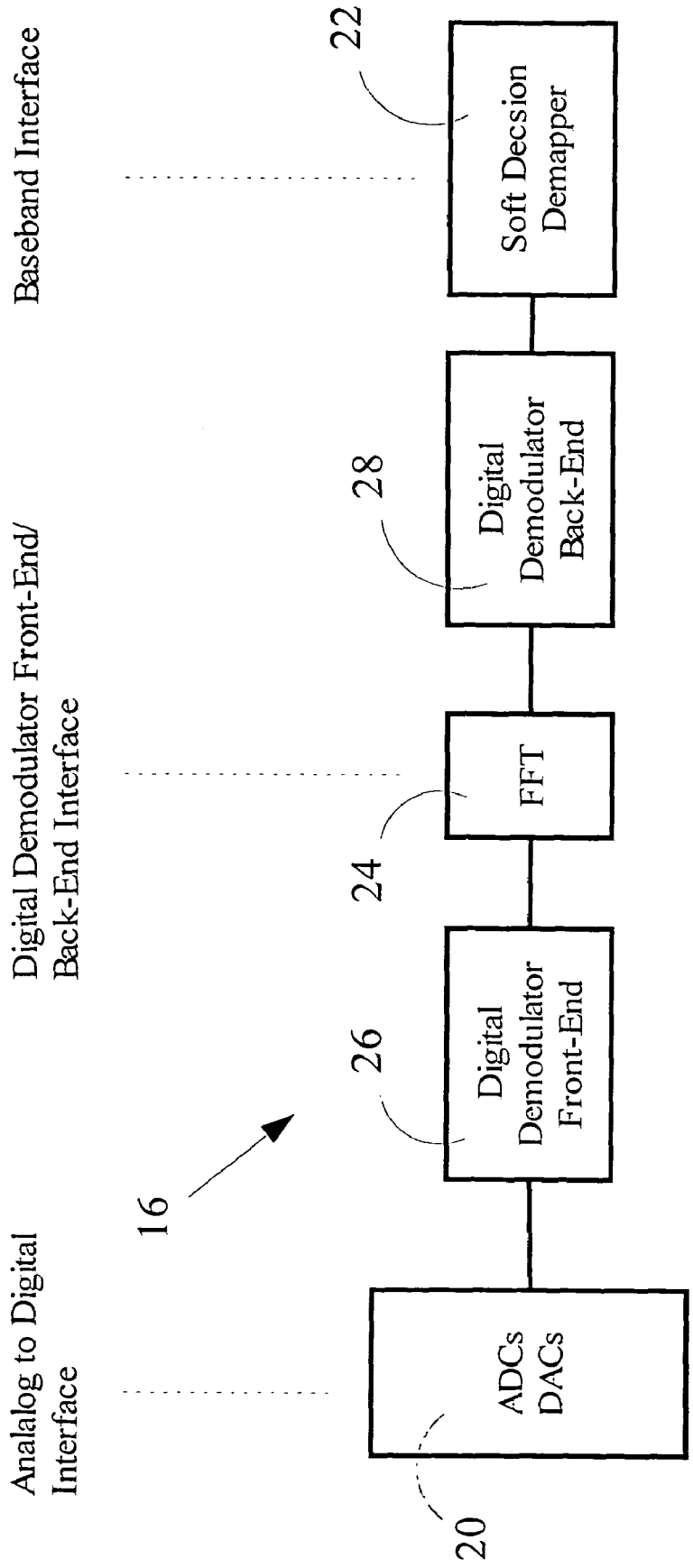
FIG. 2 depicts a block diagram of a digital demodulator integral to the digital receiver of FIG. 1.

FIG. 2 depicts the digital demodulator 16 of FIG. 1. As shown in the diagram, the analog to digital interface is located at block ADCs/DACs 20. The baseband interface can also be seen in the figure at the soft decision demapper 22. It can also be seen in the figure that the digital demodulator 16 is distinctly divided into two parts by the Fast Fourier Transform (FFT) circuit 24. To the left is the digital demodulator front-end (DFE) 26, while to the right is the digital demodulator back-end (DBE) 28. The invention of the present invention is provided in the digital demodulator front-end 26.

Figure 3:
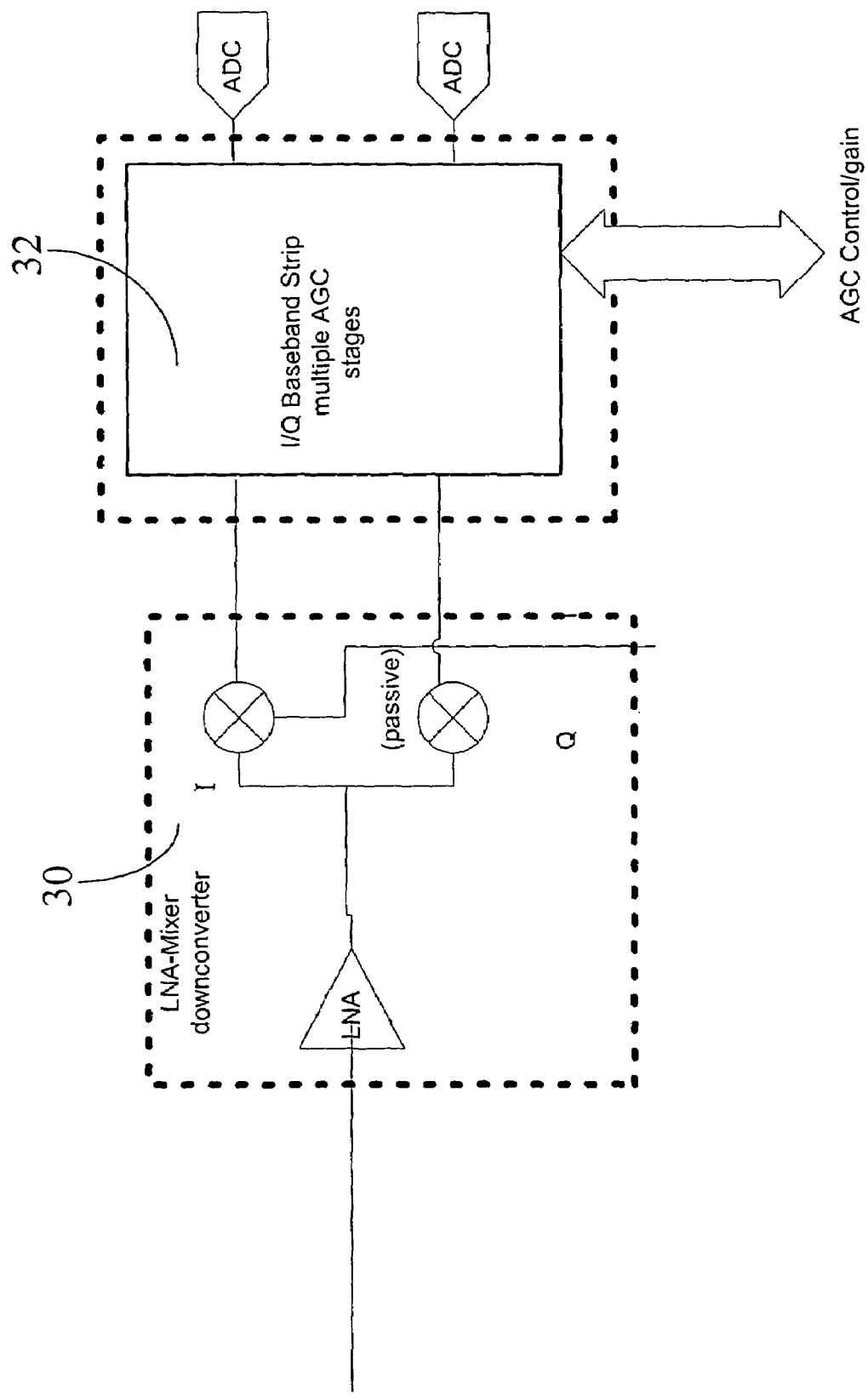
FIG. 3 depicts an I/Q baseband strip of the digital demodulator front-end of FIG. 2.

More specifically, the invention is contained in the baseband I/Q strip containing multiple AGC stages, as more clearly depicted in FIG. 3. As shown in the figure, received radio frequency (RF) signals are processed by a low noise amplifier (LNA) mixer downconverter 30. A local oscillator signal is mixed with a high frequency (e.g. 400-2500 Mhz) RF input signal which is then downconverted to a lower intermediate frequency (IF) (e.g. 10 MHz to 500 MHz) output signal. As will be appreciated, a quadrature generator (not shown) functions as a signal source that provides in-phase (I) and quadrature (Q) signals to the I/Q baseband strip 32. The LNA mixer 30 combines the I and Q signals with the RF signals, thereby separating the RF signals into I and Q components to facilitate demodulation. The I and Q components are fed to the I/Q baseband strip 32. As will also be appreciated, the I/Q baseband strip is analogous to an IF strip in a radio receiver which allows certain analogue functions such as amplification and filtering to be performed at a lower frequency than the received frequency.

Figure 4:
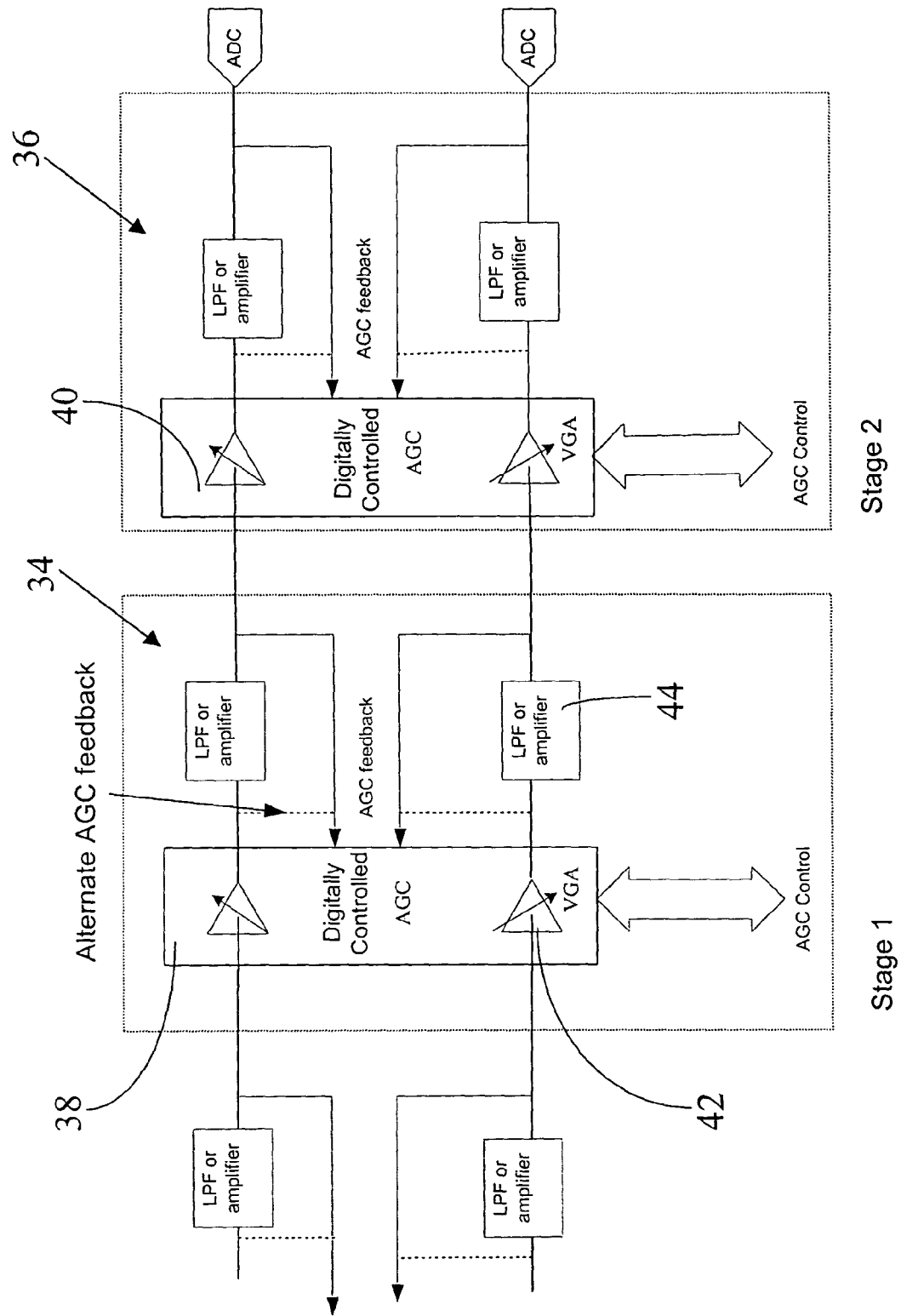
FIG. 4 depicts a more detailed view of the I/Q baseband strip of FIG. 3.

Referring to FIG. 4, a more detailed description of the I/Q baseband strip 32 of FIG. 3 is provided. As can be seen from the drawing, generally speaking I/Q baseband strip 32 is divided into a series of AGC stages, two of which are shown at 34 and 36. AGC circuits 38, 40 containing VGAs 42 are distributed between low pass filters (LPFs) or buffer amplifiers 44, and receive feedback from LPFs or buffer amplifiers 44 immediately after these components. As those skilled in the art will appreciate, an LPF is a filter that passes all frequencies below a specified frequency with little or no loss but strongly attenuates high frequencies. Depending on the application, the AGC feedback control signal may come before or after LPFs or buffer amplifiers 44.

Figure 5:
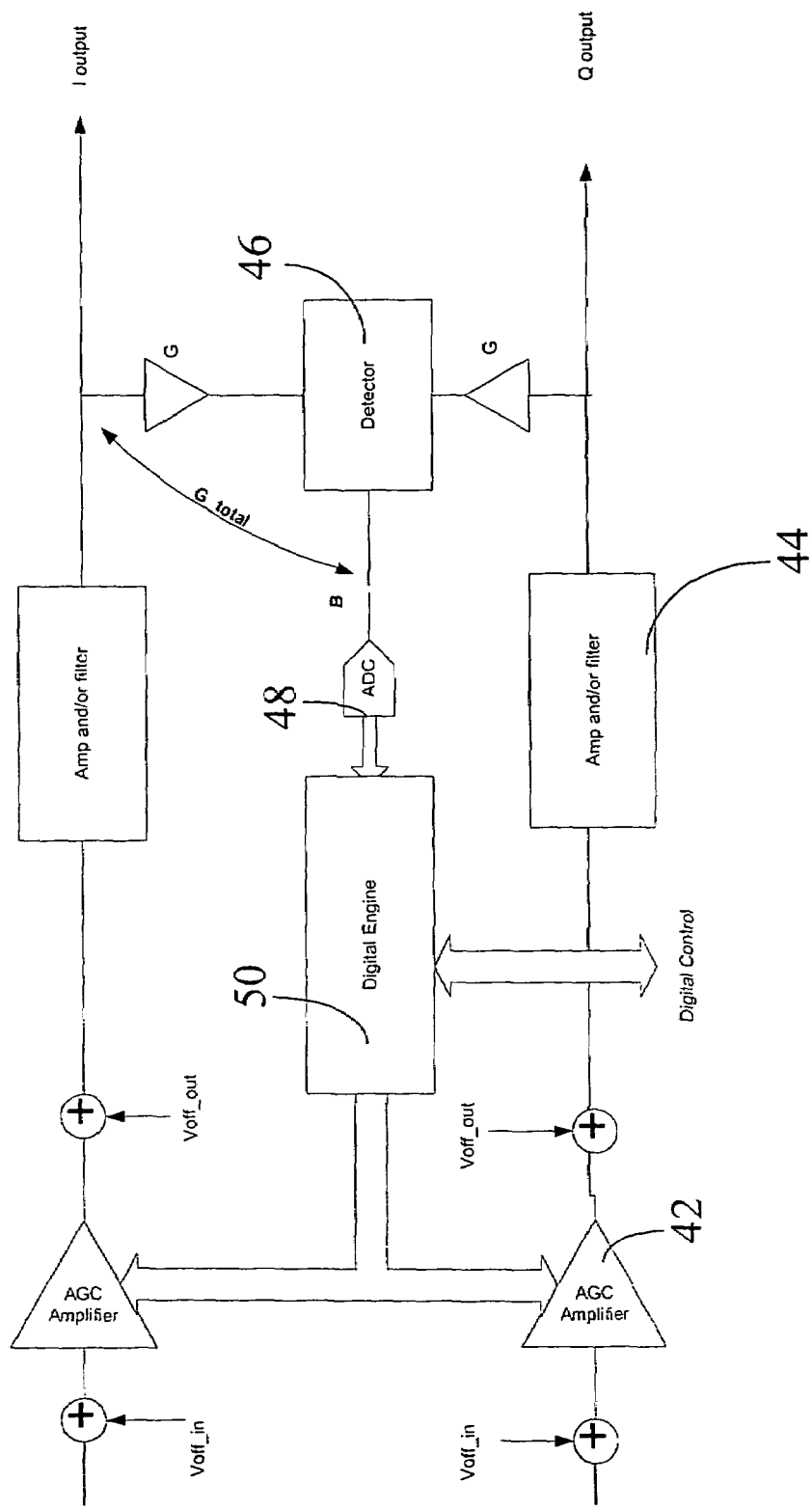
FIG. 5 depicts the digitally controlled variable gain amplifier (VGA) architecture in accordance with the present invention.

FIG. 5 depicts a single AGC stage of I/Q baseband strip 32 of FIG. 4, describing in greater detail the digitally controlled VGA architecture of the present invention. An I/Q detector 46 detects the power in I/Q signal paths (shown as I output and Q output) extending from respective VGAs 42. The architecture also includes an analogue to digital converter (ADC) 48 to digitize the detected I/Q output signals and a digital engine 50 to process differences between the detected I/Q output signals and a reference, as will be more fully described in relation to FIG. 9.

Figure 6:
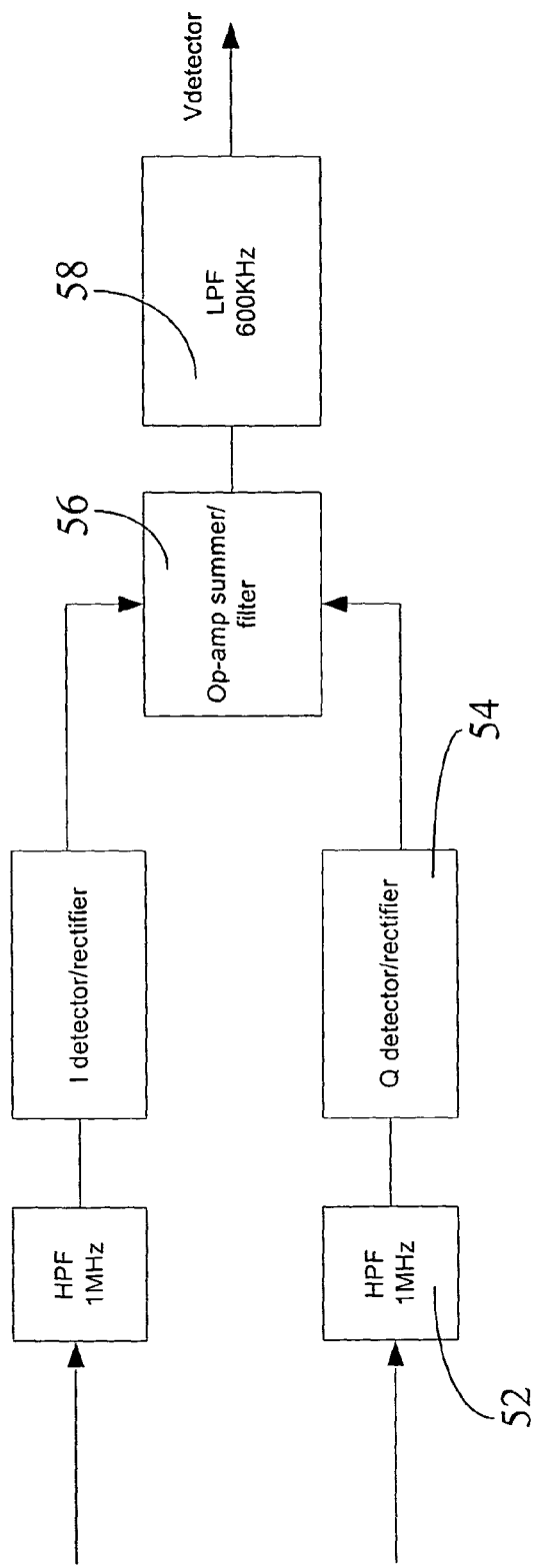
FIG. 6 depicts in greater detail the detector within the architecture of FIG. 5.

Referring to FIG. 6, the detector of FIG. 5 is described in more detail. I/Q output signals are fed to respective high pass filters (HPF) which are used to remove direct current (DC) offsets which would bias the input of detector 46. The I/Q signals then flow to respective rectifiers 54 which change the alternating current I/Q output signals to direct current, and subsequently to an operation amplifier (op-amp) 56 which adds the I/Q signals together. The resulting signal is then sent to a low pass filter (LPF) 58.

Figure 7:
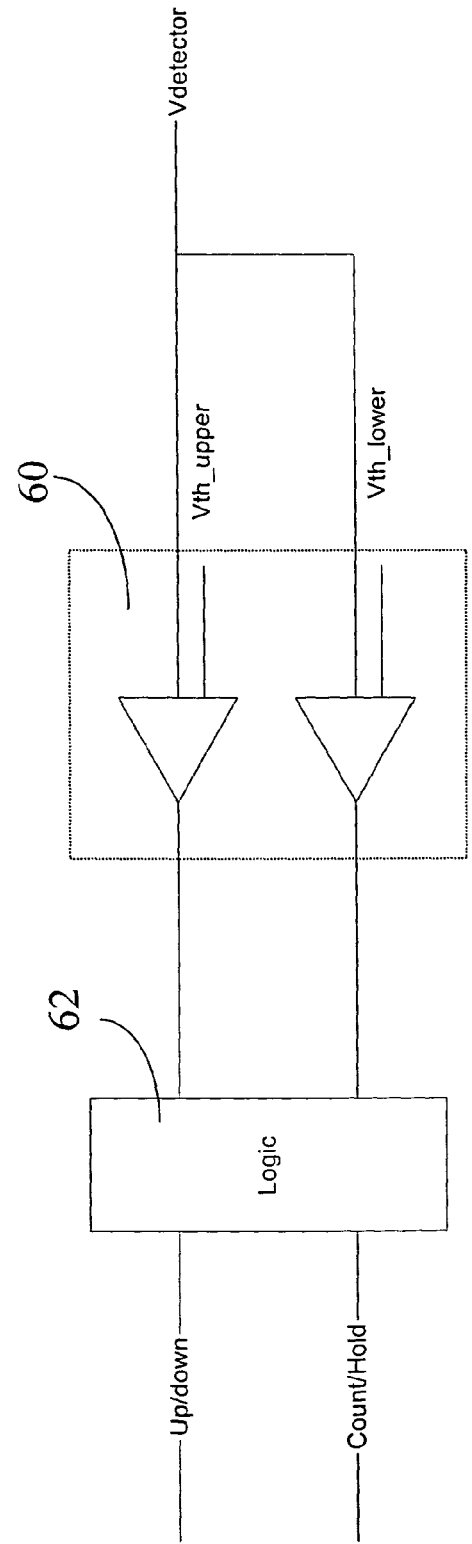
FIG. 7 depicts an analogue-to-digital (ADC) converter used in association with a two level detector.
Figure 8:
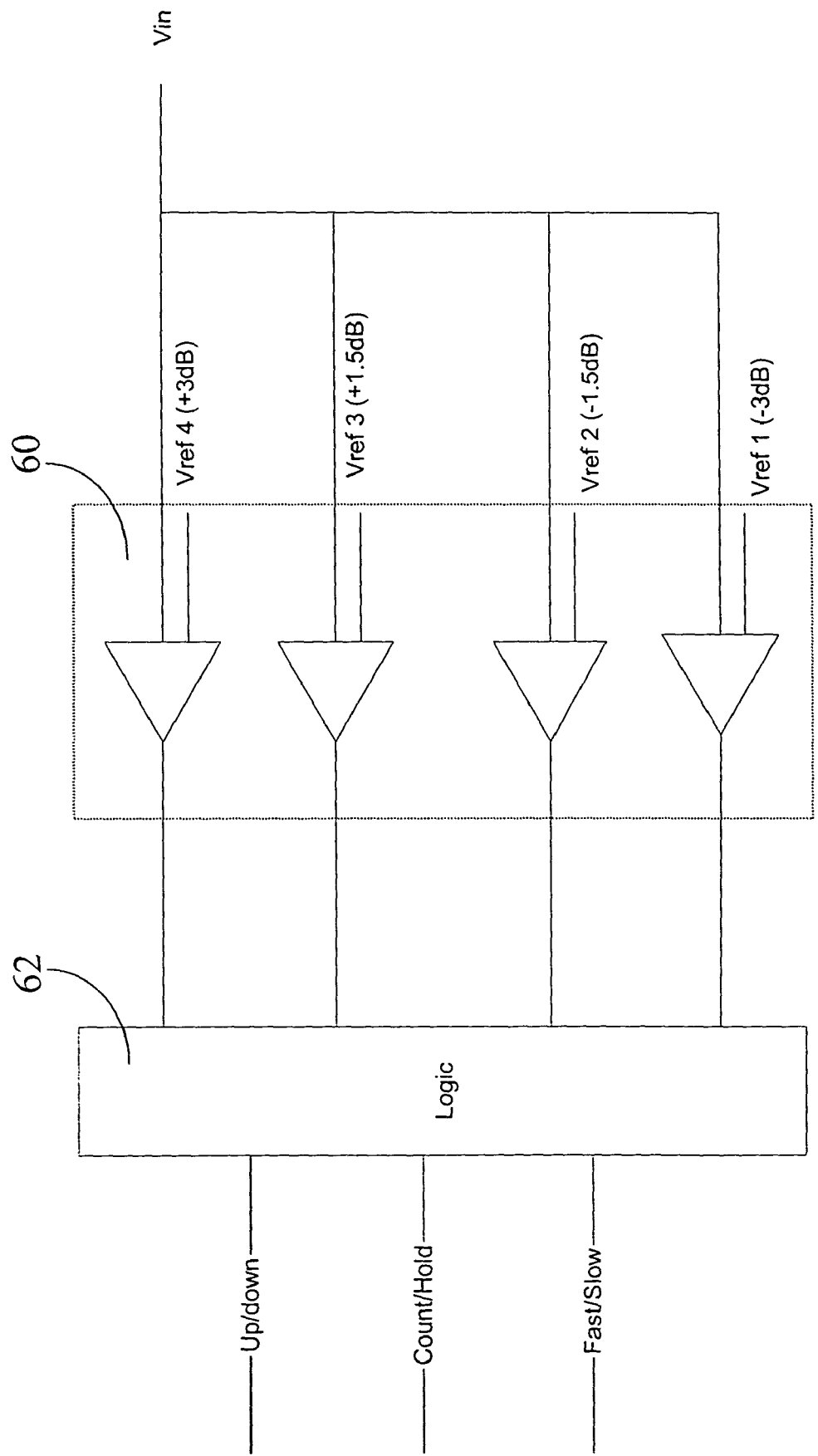
FIG. 8 depicts an analogue-to-digital (ADC) converter used in association with a four level detector.

FIGS. 7 and 8 highlight alternate analogue to digital converters (ADCs) 48 for the system of FIG. 5. The ADCs use a simple multi-level comparator 60 and some logic 62 to generate the up/down and count/hold control signals for the counter 64. The ADC 48 function can be increased to four or more levels. As will be understood by those in the art, a comparator is used to compare two numbers, to determine if a given signal is bigger or smaller than some reference voltage. This can be accomplished using a simple circuit, such as an op-amp that has no feedback. If a difference or error beyond a predefined range or boundary is determined, the gain of VGAs 42 is adjusted accordingly.

Figure 9:
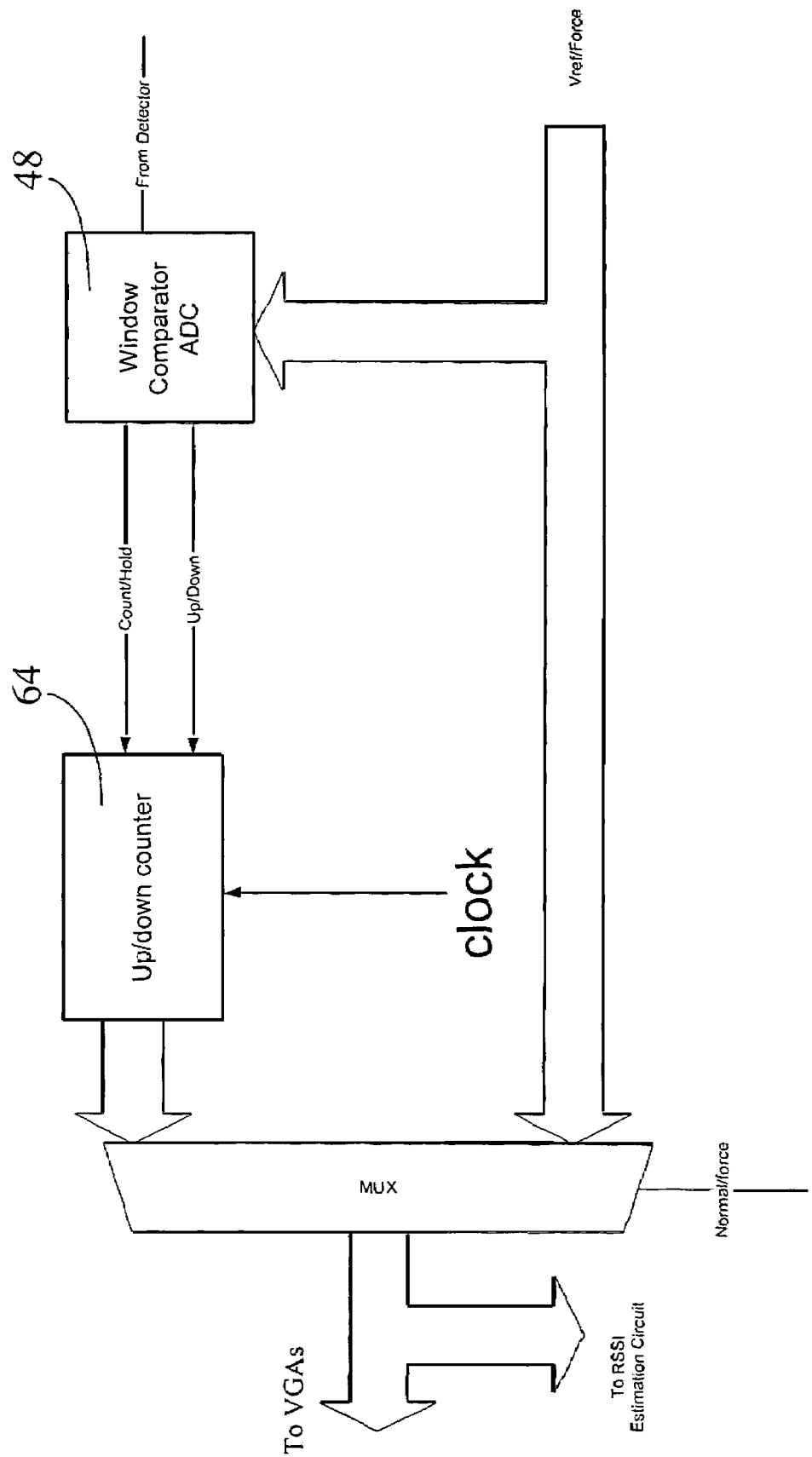
FIG. 9 depicts in greater detail the digital engine within the architecture of FIG. 6.

FIG. 9 depicts the digital engine 50 of the system of FIG. 5. The up/down and count/hold control signals generated by ADC 48 (FIG. 5) are fed to up/down counter 64. As described above, if the difference between the detected I/Q output signals and a reference (shown as Vref/force in FIG. 9) is sufficiently large, the gains of the digitally controlled VGAs 42 are adjusted by the counter 64 to bring the I/Q output signals to within a "target zone", as discussed in relation to FIG. 10. More specifically, the gain will either be held at its present/desired value, or adjusted up or down until the desired level is met.

Figure 10:
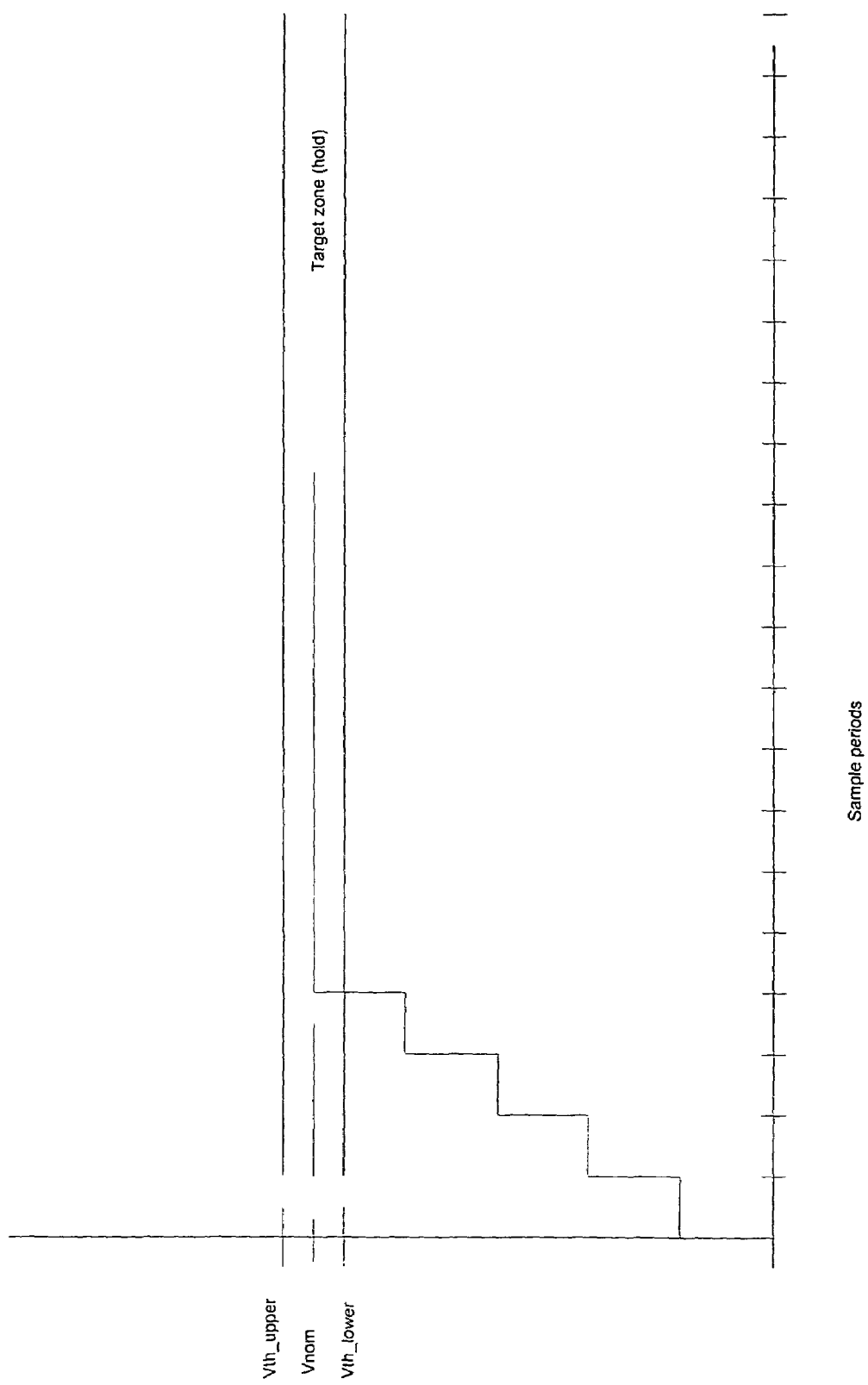
FIG. 10 depicts a graph representing the counter action versus time of the up/down counter of FIG. 9.
Figure 11:
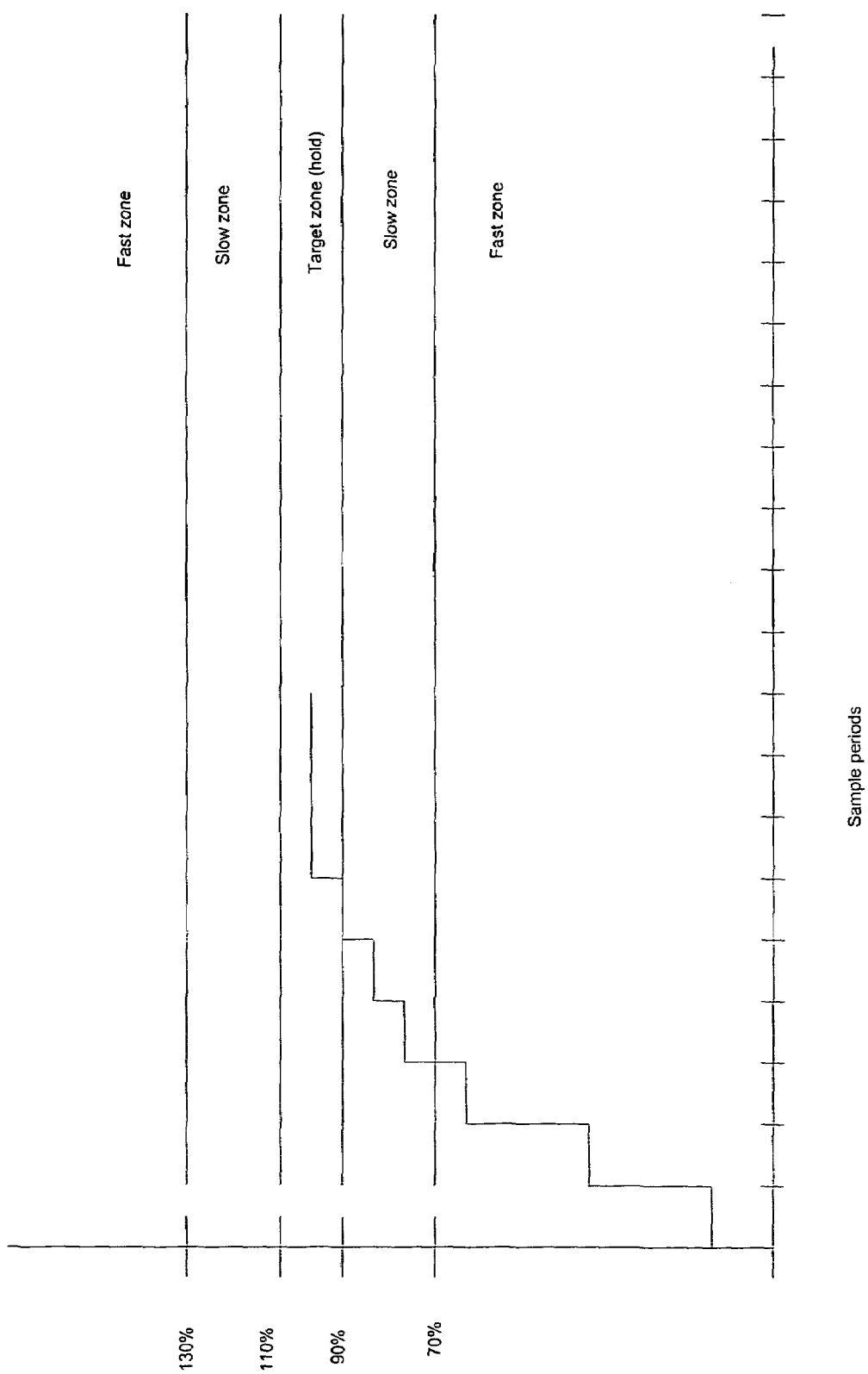
FIG. 11 depicts a graph similar to the graph of FIG. 10, but which includes four target zones.

FIG. 10 depicts a graph representing the counter action versus time of the up/down counter of FIG. 9. As shown in the figure, the counter tries to achieve a "target zone" extending between Vth_Upper and Vth_Lower. When Vnom is reached, the gain is held. As shown in FIG. 11, this concept can be extended to more than one level e.g. four target zones are depicted. As shown in the Figure, the gain will be adjusted at a fast rate with a fixed amplitude increment if the detected error is well outside the defined range, and at a slower rate with a fixed amplitude increment as the target zone is approached. This dual-speed option improves dynamic settling of the AGC system. Alternately, it is possible to adjust the gain control at a fixed rate, but with a large amplitude increment if the detected error is well outside the defined range and with a small amplitude increment as the target zone is approached.

In essence, staggered AGCs are arranged by employing digitally controlled VGAs and a closed feedback loop control system for respective I and Q VGAs within each AGC stage. The output signals from respective I and Q VGAs is detected to determine if adjustment to the VGA gain is required. The detected I/Q output signal is digitized and converted to digital control signals which are ultimately fed to the respective I and Q VGAs. For a received RF signal, this process is completed by each AGC stage within the staggered AGC architecture, with the goal of providing a consistent output signal from the digital demodulator front-end.

As will be understood by those skilled in the art, the present invention relates to integrated circuits in which a staggered AGC incorporating digitally controlled VGAs is used in combination with other components to form a useful circuit within an integrated circuit. The individual electronic and processing functions utilized in the foregoing described embodiment are, individually, well understood by those skilled in the art. It is to be understood by the reader that a variety of other implementations may be devised by skilled persons for substitution and the claimed invention herein is intended to encompass all such alternative implementations, substitutions and equivalents. Persons skilled in the field of electronic and integrated circuit design will be readily able to apply the present invention to an appropriate implementation for a given application.

Consequently, it is to be understood that the particular embodiments shown and described herein by way of illustration are not intended to limit the scope of the invention claimed by the inventors/assignee, which is defined by the appended claims.

I claim:

1. In a wireless receiver where a radio frequency signal is received, downconverted, and processed into in-phase (I) and quadrature (Q) signal paths, a method of automatic gain control (AGC) comprising:
   (a) at a specified stage in an I/Q baseband strip containing multiple automatic gain control (AGC) stages, each of the AGC stages having locally generated control signals associated therewith:
      detecting respective I and Q output signals received from respective I and Q variable gain amplifiers (VGAs) associated with the specified AGC stage to produce a detected I and Q signal, the detecting comprising:
         passing the respective I and Q output signals through respective high pass filters (HPFs) to remove direct current offsets,
         rectifying each of the respective I and Q filtered output signals,
         adding the respective I and Q rectified filtered output signals in an operational amplifier, and
         passing the added I and Q rectified filtered output signal through a low pass filter (LPF) to produce the detected I and Q signal;
      generating at least one digital counter signal responsive to differences between the detected I and Q signal and at least one reference signal;
      generating a control signal by multiplexing the at least one digital counter signal with the at least one reference signal; and
      controlling the respective I and Q VGAs with the control signal; and
   (b) repeating (a) through each AGC stage.

2. The method of claim 1 comprising using a multi-level comparator and a logic circuit to generate digital up/down and count/hold control signals.

3. The method of claim 2 where the at least one digital counter signal includes at least digital up/down and count/hold control signals and where generating the at least one digital counter signal comprises:
   receiving in an up/down counter the digital up/down and count/hold control signals; and
   setting the gains of the respective I and Q VGAs.

4. The method of claim 3 where the setting comprises:
   if the detected I and Q signal falls outside a predefined boundary, modifying the gains of the respective I and Q VGAs until the respective I and Q output signals achieve desired magnitudes;
   else, maintaining the gains of the respective I and Q VGAs.

5. The method of claim 4 where the modifying comprises adjusting the respective I and Q VGAs at a fast rate if the detected I and Q signal is beyond a first predefined range or at a slow rate if the detected I and Q signal is beyond a second predefined range but not beyond the first predefined range.

6. The method of claim 4 where the modifying comprises adjusting the respective I and Q VGAs at a large magnitude if the detected I and Q signal is beyond a first predefined range or at a small magnitude if the detected I and Q signal is beyond a second predefined range but not beyond the first predefined range.

7. In a wireless receiver where a radio frequency signal is received, downconverted, and processed into in-phase (I) and quadrature (Q) signal paths, an automatic gain control (AGC) circuit comprising multiple AGC stages where each of the AGC stages includes:
   (a) respective I and Q variable gain amplifiers (VGAs);
   (b) a detector to detect respective I and Q output signals received from the respective I and Q VGAs and to produce a detected I and Q output signal;
   (c) an analog to digital converter (ADC) to convert the detected I and Q output signal to a digital detected I and Q output signal;
   (d) a digital engine to digitally adjust the respective I and Q VGAs responsive to the digital detected I and Q output signal;
   where the detector comprises:
      i. respective I and Q high pass filters (HPFs) to remove direct current (DC) offsets from the respective I and Q output signals;
      ii. respective rectifiers communicating with the respective I and Q HPFs to change the respective filtered I and Q output signals from alternating current (AC) to direct current (DC);
      iii. an operational amplifier (Op-amp) communicating with the rectifiers to add the rectified filtered I and Q output signals; and
      iv. a low pass filter (LPF) communicating with the Op-amp to filter the added rectified filtered I and Q output signal to produce the detected I and Q output signal;
   and where the ADC comprises:
      i. a multi-level comparator to compare the detected I and Q output signal to at least one reference signal; and
      ii. a logic circuit to generate at least one digital counter signal responsive to the multi-level comparator; and
   where the digital engine comprises:

i. an up/down counter to generate an up/down counter signal responsive to the at least one digital counter signal; and ii. a multiplexer to generate a control signal that digitally adjusts the respective I and Q VGAs by multiplexing the up/down counter signal with the at least one reference signal.

8. The automatic gain control circuit of claim 7 where the number of levels in the multi-level comparator is at least four.

9. The automatic gain control circuit of claim 8 where the up/down counter is adapted to set gains associated with the respective I and Q VGAs.

10. A wireless receiver including a plurality of serially connected automatic gain control stages, each stage comprising:

I and Q variable gain amplifiers (VGAs) to generate I and Q signals, respectively;

a detector to generate a detect signal from the I and Q signals;

an analog to digital converter (ADC) to convert the detect signal to a digital detect signal;

a digital engine to generate a control signal responsive to the digital detect signal and a reference signal;

where the detector comprises:

i. respective I and Q high pass filters (HPFs) to remove direct current (DC) offsets from the I and Q signals;

ii. respective rectifiers communicating with the respective I and Q HPFs to change the filtered I and Q signals from alternating current (AC) to direct current (DC);

iii. an operational amplifier (op amp) communicating with the rectifiers to add the rectified filtered I and Q signals; and iv. a low pass filter (LPF) communicating with the op-amp to filter the added rectified filtered I and Q signal to produce the detect I and Q output signal; and where the ADC comprises:

i. a multi-level comparator to compare the detect I and Q signal to the reference signal; and ii. a logic circuit to generate at least one digital counter signal responsive to the multi-level comparator; and where the digital engine comprises:

i. an up/down counter to generate an up/down counter signal responsive to the at least one digital counter signal; and ii. a multiplexer to generate a control signal that digitally adjusts the I and Q VGAs by multiplexing the up/down counter signal with the reference signal.

11. The wireless receiver of claim 10 comprising:

I and Q buffer amplifiers between the variable gain amplifiers and the detector to buffer the I and Q signals, respectively.

12. The wireless receiver of claim 10 where the respective I and Q high pass filters are configured to generate I and Q filtered signals by removing direct current offsets from the I and Q signals.

13. The wireless receiver of claim 12 where the respective rectifiers communicating with the respective I and Q high pass filters are configured to change each of the I and Q filtered signals from alternating current to direct current, producing the I and Q rectified filtered signals.

14. A method comprising:

at each of a plurality of serially connected automatic gain control stages, each of the stages having a respective I variable gain amplifier with a respective I output signal and a respective Q variable gain amplifier with a respective Q output signal, generating a respective detect signal from the respective I and Q output signals;

at each of the stages, converting the respective detect signal to a respective digital detect signal;

at each of the stages, generating a respective control signal to control the respective I and Q variable gain amplifiers responsive to the respective digital detect signal;

at each of the stages, adjusting the respective I and Q variable gain amplifiers responsive to the respective control signal; and where the generating comprises:

high pass filtering the I and Q output signals by removing direct current offsets from the respective I and Q output signals;

rectifying the high pass filtered I and Q output signals to thereby change the high pass filtered I and Q output signals from alternating current to direct current I and Q rectified signals;

summing the direct current I and Q rectified signals to generate summed I and Q output signals; and low pass filtering the summed I and Q output signals to generate the detect signal; where the converting comprises:

comparing the detect signal to at least one respective reference signal via a multi-level comparator; and logically manipulating the compared signal to generate at least one digital counter signals; and where the generating comprises:

logically manipulating the compared signal to thereby generate an up/down counter signal; and multiplexing the up/down counter signal with the at least one respective reference signal to generate the control signal.

* * * * *

UNITED STATES PATENT AND TRADEMARK OFFICE
CERTIFICATE OF CORRECTION

| | | |
|---|---|---|
| PATENT NO. | : 7,433,431 B2 | |
| APPLICATION NO. | : 10/661945 | |
| DATED | : October 7, 2008 | |
| INVENTOR(S) | : Neil Birkett | |

It is certified that error appears in the above-identified patent and that said Letters Patent is hereby corrected as shown below:

At column 1, line 4, please delete "CROSS-REFERENCE TO RELATED APPLICATIONS".

At column 8, line 43, please delete "signals;" and insert --signal;--.

Signed and Sealed this

Ninth Day of November, 2010

David J. Kappos
*Director of the United States Patent and Trademark Office*